United States Patent [19]

Olsen et al.

[11] 4,260,525

[45] Apr. 7, 1981

[54] SINGLE-CRYSTAL HEXABORIDES AND METHOD OF PREPARATION

[75] Inventors: Gregory H. Olsen, Dayton; Alfred V. Cafiero, Old Bridge, both of N.J.

[73] Assignee: RCA Corporation, New York, N.Y.

[21] Appl. No.: 963,817

[22] Filed: Nov. 27, 1978

[51] Int. Cl.³ ............................................. H01B 1/06
[52] U.S. Cl. ................................. 252/521; 252/518; 313/346 R
[58] Field of Search ............................ 252/521, 518; 313/346 R

[56] References Cited

U.S. PATENT DOCUMENTS

| | | | |
|---|---|---|---|
| 2,639,399 | 5/1953 | Lafferty | 313/346 R |
| 3,932,314 | 1/1976 | Kawabe et al. | 252/521 |
| 4,054,946 | 10/1977 | Fenis et al. | 252/521 |
| 4,055,780 | 10/1977 | Kawai et al. | 313/346 R |

OTHER PUBLICATIONS

"Single Crystal Growth of Mixed Hexaborides", *Journal of Crystal Growth*, Olsen 3-1978, pp. 287–290, vol. 44.

Futamoto et al., Japan Journal Appl. Phys., vol. 14, No. 9, pp. 1263–1266, 1975, and Aita et al., Japan Journal Appl. Physics; vol. 13, No. 2, p. 391, 1974.

Fisk et al., Mat. Res. Bull., vol. 7, pp. 285–288, 1972.

*Primary Examiner*—Benjamin R. Padgett
*Assistant Examiner*—J. L. Barr
*Attorney, Agent, or Firm*—H. Christoffersen; Birgit E. Morris

[57] ABSTRACT

An aluminum flux method of preparing binary, ternary, and quaternary single crystal metal hexaborides. The single crystals are prepared by mixing a metal oxide, carbonate, or nitrate compound with boron powder in an amount of aluminum which will solubilize the boron at a reaction temperature of from about 1200° C. to about 1600° C. The mixture is held at the reaction temperature for a sufficient time to form the desired single crystal hexaboride.

22 Claims, No Drawings

SINGLE-CRYSTAL HEXABORIDES AND METHOD OF PREPARATION

This invention relates to a method of forming binary, ternary, and quaternary metal hexaborides. More specifically, the invention relates to an aluminum flux method of preparing binary, ternary, quaternary single crystal metal hexaborides.

BACKGROUND OF THE INVENTION

Methods for the preparation of lanthanum hexaboride, europium hexaboride and europium yttrium hexaboride crystals are known. The crystals have been used as cathodes for thermionic emission and field emission devices. The crystals have been produced basically by two methods.

A hot pressing technique described by Kawabe et al in U.S. pat. No. 3,932,314 to form $(Y_{1-x}Eu_x)B_6$ comprises, inter alia, mixing the oxides $Y_2O_3$ and $Eu_2O_3$ with boron powder and polyvinyl alcohol as a molding agent and thereafter applying a pressure of about 1 ton/cm² to compact the powders with subsequent heating in a boron nitride crucible at a temperature of about 1525° C. for 1 hour in a vacuum of $10^{-2}$ to about $10^{-3}$ Torr.

Tanaka et al, J. Crystal Growth, 40 (1977), pp. 125-128, describe the formation of $EuB_6$ by a borothermal reduction according to the following equation:

$$Eu_2O_3 + 15B \rightarrow 2EuB_6 + 3BO$$

The borothermal formation of $EuB_6$ is similar to the work of Kawabe et al in that it involves the reaction of $Eu_2O_3$ with boron powder, high pressure compressing and subsequent heating. The hot pressing technique tends to form polycrystalline materials which may incorporate binder impurities into the crystal which can degrade the performance of the hexaboride material.

U.S. Pat. No. 4,054,946 describes the formation of $LaB_6$ single crystals by an aluminum flux technique. High purity lanthanum metal, boron powder and high purity aluminum are mixed together and heated to from about 1200° to about 1600° C. from a time period which may vary from several minutes to several days to produce $LaB_6$ which precipitates from the aluminum flux as a single crystal compound upon cooling of the mixture. Thereafter the aluminum flux is dissolved with a strong acid such as HCl. Futamoto et al, Japan J. Appl. Phys., Vol. 14, No. 9, 1975, and Aita et al, Japan J. Appl. Phys., Vol. 13, pp. 1263-1266, No. 2, (1974), teach similar aluminum flux techniques.

The aluminum flux technique permits the production of single crystal hexaborides. However, the reactants involved, namely lanthanum or other lanthanide metals, tend to be spontaneously combustible when exposed to oxygen and therefore, the reactions must be carried out under an inert atmosphere. The extra care and precautions which must be taken when growing single crystal hexaborides by the above technique greatly add to the cost of production.

Thus, it would be highly desirable to have a technique which can produce, binary, ternary and quaternary single crystal metal hexaborides without the impurities associated with hot pressing or the expensive precautions necessary to prevent explosions during the crystal growing process.

SUMMARY OF THE INVENTION

We have invented a method for growing binary, ternary, and quaternary single crystal hexaborides which comprises mixing with aluminum quantities of one or more metal compounds which can be the oxide, nitride or carbonate, with boron. The boron is present in an amount which is soluble in the aluminum at the crystal growing temperature. The mixture is heated to a temperature of from about 1200° C. to about 1600° C. for a sufficient time to form the single crystal hexaboride. Thereafter, the aluminum is dissolved away from the single crystal hexaboride with a strong acid such as HCl or a strong base such as NaOH. The crystals are useful as cathodes for thermionic emission devices.

DETAILED DESCRIPTION OF THE INVENTION

The binary, ternary and quaternary single-crystal hexaborides which can be grown according to my method, can be illustrated by the formula:

$$L_xM_zR_{1-x-z}B_6$$

where L is selected from the group consisting of cesium (Cs), barium (Ba) and the lanthanides. Preferred lanthanides are lanthanum (La), cerium (Ce) and europium (Eu). M and R are selected from the group consisting of Cs, Ba, La, yttrium (Y) and the lanthanides. Preferably M and R are selected from the group consisting of La, Ce, Eu, Cs, Ba and Y. X is greater than 0 but less than or equal to 1, z is greater than or equal to 0 but less than 1, and $1-x-z$ is less than 1.

When x is equal to 1 and z is equal to 0, the formula reduces to the binary single crystal hexaborides $LB_6$. When $1-x-z$ is equal to 0, and z is greater than 0, the formula reduces to the ternary single crystal hexaborides $L_xM_zB_6$. Examples of ternary single crystal hexaborides are, inter alia, $La_xEu_zB_6$, $La_xY_zB_6$, $La_xCs_zB_6$, $Eu_xY_zB_6$ and $Eu_xBa_zB_6$. When both x and z are greater than zero, the formula illustrates quaternary single crystal hexaborides subject to the limitations previously given for x and z. Examples of single crystal hexaborides are, inter alia, $La_xEu_zY_{1-x-z}B_6$ and $La_xEu_zBa_{1-x-z}B_6$.

The method for growing a binary, ternary, or quaternary single-crystal hexaboride is exemplified by the following reaction for lanthanum hexaboride ($LaB_6$):

$$La_2O_3 + B + Al \xrightarrow{\Delta H} LaB_6 + Al_2O_3 + \text{(other byproducts)}$$

The aluminum, which is in a molten state at the reaction temperature, is used as the growth medium, i.e., flux, for the metal compound and boron mixture.

The single crystal hexaborides are formed by mixing the oxide, carbonate or nitrate metal compound or compounds with boron powder. That amount of boron can be present which is soluble in the aluminum flux at the reaction temperature. The solubility of the boron in aluminum increases with an increase in the reaction temperature and therefore, larger and greater amounts of single-crystal hexaborides can be grown in the same amount of aluminum flux at higher reaction temperatures. The solubility of boron in aluminum is about 1% at about 1200° C., 2% at about 1350° C. and about 3% at 1500° C.

The reactants of the desired single-crystal hexaboride are mixed together and placed in a rectangular alumina boat. The alumina boat containing the reactants is heated to a reaction temperature of from about 1200° C. to about 1600° C. in an inert atmosphere of argon, nitrogen, helium, or like gases. The reaction temperature is maintained for a sufficient time to form the single-crystal hexaboride. Depending upon the size of the crystals desired and the amount of reactants, the reaction time is from about 5 hours to about 5 days. Thereafter, the crystals contained in the aluminum flux are cooled to 600° C. at a linear rate of from about 5° to about 20° C. per hour. Although not critical, the temperature of the furnace during the reaction period is maintained within 1 degree C./hr. Alternatively, the furnace can be cooled exponentially according to the following formula:

$$T = T_o e^{-\alpha \tau}$$

wherein "T" is the temperature, "$\alpha$" is the cooling rate, $T_o$ is the initial temperature, and "$\tau$" is the time of cooling. Longer crystals are obtained when the reaction mixture is exponentially cooled. For example, an initial exponential cooling rate of about 15° C./hr. from about 1500° C. produces longer crystals than linear cooling of the reaction mixture from 1500° C. After cooling, the single-crystal hexaborides are separated from the aluminum matrix with an acid such as HCl.

Ternary as well as quaternary single crystals can be produced according to my method. However, no precise correlations can be made between starting oxide powder ratios and crystal composition since a range of compositions often results. The crystals formed by the method usually have a single composition that is within 15 mole percent of the powder composition. Ternary single crystals produced according to my invention tend to be richer in one metal then the starting mixture according to the descending order: La, Eu, Ba and Y. In other words, equi-molar mixtures of $Eu_2O_3$ and $BaCO_3$ will produce Eu-rich crystals. However, a mixture of 90 weight percent $La_2O_3$ powder and 10 weight percent $CsNO_3$ powder formed a single crystal with a structure similar to $LaB_6$ and had a concentration of cesium of only 0.1 weight percent as determined by atomic absorption measurements. The following examples illustrate the method according to my invention of preparing binary, ternary, quaternary single-crystal hexaborides. However, it is not my intention to limit my invention solely to the examples described hereafter. I intend to include within the scope of my invention such modifications as would be obvious to the ordinary worker skilled in the art of preparing metal hexaborides.

EXAMPLE 1

$LaB_6$ single crystals were formed by mixing 22.5167 grams of aluminum having a purity of 99.999% with 0.4503 gram of 99.999% pure boron powder and 1.1302 grams of $La_2O_3$ having a purity of 99.999%.

The mixture was placed in a rectangular alumina boat 15 cm² and placed in a furnace. The mixture was heated to about 1400° C. for about 5 days and thereafter cooled at a rate of 8° C. per hour. Upon cooling to room temperature, the solidified mixture was etched in concentrated HCl for a sufficient time to dissolve away the aluminum flux. $LaB_6$ crystals having a size of about 1.0 mm by 1.0 mm by 3 mm were recovered. The X-ray diffraction pattern of the above compound yielded a lattice parameter of 4.1568, corresponding to $LaB_6$. The crystal was spot welded to a rhenium wire through which a current was passed to heat the crystal to about 1180° C. A current density of 1.0 amp/cm² was measured.

EXAMPLES 2-4

The following examples of binary single crystals were prepared in accordance with the procedure outlined in Example 1. All weights are in grams unless otherwise indicated.

| | BINARY HEXABORIDES | | |
|---|---|---|---|
| Example | 2 | 3 | 4 |
| Theoretical Crystal Composition | $EuB_6$ | $BaB_6$ | $CeB_6$ |
| Al | 23.4379 | 21.1060 | 23.5680 |
| B | 0.4688 | 0.6332 | 0.2340 |
| $Eu_2O_3$ | 1.2727 | — | — |
| $BaCO_3$ | — | 1.9250 | — |
| $Ce_2O_3$ | — | — | 0.5880 |
| Crystal Produced | $EuB_6$ | $BaB_6$ | $CeB_6$ |

EXAMPLES 5-16

The following ternary single-crystal hexaborides were prepared in accordance with the procedure outlined in Example 1, with the following exceptions. Example 5 was reacted at about 1400° C. and cooled at a rate of about 8° C./hr. Examples 6, 7, 14 and 16 were reacted at about 1400° C. and cooled at a rate of about 5° C./hr. Examples 8 and 12 were reacted at about 1500° C. and cooled at a rate of about 15° C./hr. Example 9 was reacted at about 1500° C. and cooled exponentially starting with a rate of 15° C./hr. Example 15 was reacted at 1500° C. and cooled at a rate of about 20° C./hr. Examples 10, 11, 12 and 13 were reacted at about 1360° C. and cooled at a rate of about 5° C./hr. The chemical analysis of Examples 11 and 13 indicated the presence of lanthanum, yttrium, and boron but the X-ray and electron probe analysis were unable to give a specific crystal structure.

| | TERNARY HEXABORIDES | | | | |
|---|---|---|---|---|---|
| Example | 5 | 6 | 7 | 8 | 9 |
| Theoretical Crystal Composition | $La_{.5}Eu_{.5}B_6$ | $La_{.8}Eu_{.2}B_6$ | $La_{.2}Eu_{.8}B_6$ | $La_{.5}Ba_{.5}B_6$ | $La_{.9}Cs_{.1}B_6$ |
| Al | 25.4600 | 25.7140 | 20.8359 | 24.9844 | 25.5503 |
| B | 0.5192 | 0.5143 | 0.4167 | 0.4997 | 0.7665 |
| $La_2O_3$ | 0.6490 | 1.0286 | 0.2084 | 0.6246 | 1.7323 |
| $Eu_2O_3$ | 0.7009 | 0.2829 | 0.8959 | — | — |
| $BaCO_3$ | — | — | — | 0.7745 | — |
| $CsNO_3$ | — | — | — | — | 0.2300 |
| $Y_2O_3$ | — | — | — | — | — |

-continued

TERNARY HEXABORIDES

| Crystal Produced | $La_{.23}Eu_{.74}B_6$ | $La_{.91}Eu_{.09}B_6$ | $Eu_{.37}Eu_{.63}B_6$ | $La_{.52}Ba_{.48}B_6$ | $La_{.999}Cs_{.001}B_6$ |
|---|---|---|---|---|---|
| Example | 10 | 11 | 12 | 13 | 14 |
| Theoretical Crystal | $La_{.9}Y_{.1}B_6$ | $La_{.2}Y_{.8}B_6$ | $La_{.5}Y_{.5}B_6$ | $La_{.4}Y_{.6}B_6$ | $Eu_{.5}Ba_{.5}B_6$ |
| Al | 22.8063 | 20.8010 | 24.1499 | 21.7529 | 23.3120 |
| B | 0.4561 | 0.4160 | 0.4830 | 0.4351 | 0.4662 |
| $La_2O_3$ | 1.0310 | 0.2088 | 0.6037 | 0.4568 | — |
| $Eu_2O_3$ | — | — | — | — | 0.6294 |
| $BaCO_3$ | — | — | — | — | 0.7227 |
| $CsNO_3$ | — | — | — | — | — |
| $Y_2O_3$ | 0.0798 | 0.5824 | 0.4105 | 0.4351 | — |
| Crystal Produced | $La_{.97}Y_{.03}B_6$ | — | $La_{.02}Y_{.98}B_6$ | — | $Eu_{.86}Ba_{.14}B_6$ |

| Example | 15 | 16 |
|---|---|---|
| Theoretical Crystal | $Eu_{.8}Y_{.2}B_6$ | $Eu_{.9}Y_{.1}B_6$ |
| Al | 24.6595 | 25.8229 |
| B | 0.4933 | 0.5165 |
| $La_2O_3$ | — | — |
| $Eu_2O_3$ | 1.0604 | 1.2602 |
| $BaCO_3$ | — | — |
| $CsNO_3$ | — | — |
| $Y_2O_3$ | 0.1726 | 0.0904 |
| Crystal Produced | $Eu_{.65}Y_{.35}B_6$ | $Eu_{.92}Y_{.08}B_6$ |

EXAMPLES 17–18

The following quaternary single-crystal hexaborides were prepared according to the general procedure outlined in Example 1, with the following changes. Example 17 was reacted at 1400° C. and thereafter cooled at a rate of about 8° C./hr. Example 18 was reacted at about 1300° C. and cooled at a rate of about 5° C./hr. The chemical analysis of Examples 17 and 18 indicated the presence of La, Eu, Y, $B_6$ and La, Eu, Ba, $B_6$ respectively. However, X-ray and electron probe analysis was unable to give a specific crystal structure.

QUATERNARY HEXABORIDES

| Example | 17 | 18 |
|---|---|---|
| Theoretical Crystal Composition | $La_{.7}Eu_{.2}Y_{.1}B_6$ | $La_{.5}Eu_{.4}Ba_{.1}B_6$ |
| Al | 19.2982 | 21.2719 |
| B | 0.3860 | 0.4250 |
| $La_2O_3$ | 0.6793 | 0.5318 |
| $Eu_2O_3$ | 0.2104 | 0.4680 |
| $BaCO_3$ | — | 0.1276 |
| $CsNO_3$ | — | — |
| $Y_2O_3$ | 0.0675 | — |

I claim:

1. A method of fabricating a single crystal metal hexaboride comprising:
   mixing a metal oxide, nitrate or carbonate compound of the metal component(s) of the hexaboride and boron with sufficient aluminum to dissolve the boron at a reaction temperature of from about 1200° C. to about 1600° C.;
   heating the mixture to a temperature of from about 1200° C. to about 1600° C. for a sufficient time to form said single crystal metal hexaboride;
   cooling the mixture; and
   dissolving said aluminum from said single crystal hexaboride with an acid.

2. The method according to claim 1 wherein the mixture is cooled at a linear rate of from about 5° to about 20° C. per hour.

3. The method according to claim 1 wherein the mixture is cooled exponentially according to the formula $$T_f = T_0 e^{-\alpha\tau}$$

wherein $T_f$ is the final temperature, $T_0$ is the initial temperature, $\alpha$ is the rate of cooling and $\tau$ is the cooling time.

4. The method according to claim 3 wherein the initial rate of cooling is 15° C./hour.

5. The method according to claim 1 wherein the boron powder is about 1 percent of the weight of aluminum and the reaction mixture is heated to about 1200° C.

6. The method according to claim 1 wherein the boron powder is about 2 percent of the weight of aluminum and the reaction mixture is heated to about 1350° C.

7. The method according to claim 1 wherein the boron powder is about 3 percent of the weight of aluminum and the reaction mixture is heated to about 1500° C.

8. The method according to claim 1 wherein the metal of the oxide, nitrate, or carbonate compound is selected from the group consisting of Cs, Ba, La and the lanthanides.

9. The method according to claim 8 wherein the lanthanide is selected from the group consisting of La, Ce, and Eu.

10. The method according to claim 1 wherein the single crystal metal hexaboride has the formula $$L_xM_zR_{1-x-z}B_6$$

wherein L is selected from the group consisting of Cs, Ba, La and the lanthanides, M and R are selected from the group consisting of Cs, Ba, Y, La and the lanthanides, $x < 0$ but $x \leq 1$, $z \geq 0$ but $z < 1$ and $1 - x - z < 1$.

11. The method according to claim 10 wherein x is equal to 1 and z is equal to 0.

12. The method according to claim 10 wherein the lanthanides are selected from the group consisting of Ce and Eu.

13. The method according to claim 10 wherein $1-x-z$ is equal to 0.

14. The method according to claim 13 wherein the single crystal metal hexaboride is selected from $La_xY_zB_6$, $La_xEu_zB_6$, $La_xBa_zB_6$, $La_xCs_zB_6$, $Eu_xY_zB_6$ and $Eu_xBa_zB_6$.

15. The method according to claim 10 wherein x and z are greater than zero.

16. The method according to claim 15 wherein the single crystal metal hexaboride is selected from the group consisting of $La_xEu_zY_{1-x-z}B_6$ and $La_xEu_z-Ba_{1-x-z}B_6$.

17. A single crystal metal hexaboride having the formula:

$$L_xM_zR_{1-x-z}B_6$$

wherein L is selected from the group consisting of La, Cs, Ba, La, and the lanthanides, M and R are selected from the group consisting of Cs, Ba, Y, La and the lanthanides, $x>0$ but $x \leq 1$, $z>0$ but $z<1$ and $1-x-z<1$ fabricated according to the process of mixing the metal oxide, nitrate or carbonate compound of L, M and R with aluminum and an amount of boron which is soluble in said aluminum at a temperature of from about 1200° to about 1600° C., heating the mixture for a time sufficient to form said single crystal metal hexaboride, cooling the mixture and dissolving the aluminum from said single crystal metal hexaboride with an acid.

18. The single crystal metal hexaboride according to claim 17 wherein $1-x-z=0$.

19. The single crystal metal hexaboride according to claim 17 wherein x and z are greater than 0 but less than 1.

20. A ternary single crystal metal hexaboride of the formula:

$$La_xM_zB_6$$

where M is selected from the group consisting of Ba, Eu, Y and Cs, $0<x<1$, $0<z<1$ and $1-x-z=0$.

21. A ternary crystal metal hexaboride of the formula:

$$Eu_xBa_zB_6$$

where $0<x<1$, $0<z<1$, and $1-x-z=0$.

22. A quaternary single crystal metal hexaboride of the formula:

$$La_xEu_zR_{1-x-z}B_6$$

where R is selected from the group consisting of Y and Ba, $0<x<1$, $0<z<1$ and $1-x-z<1$.

* * * * *